US011056662B2

(12) United States Patent
Zhang et al.

(10) Patent No.: US 11,056,662 B2
(45) Date of Patent: Jul. 6, 2021

(54) ORGANIC LIGHT-EMITTING DEVICE AND DISPLAY DEVICE

(71) Applicant: SHANGHAI TIANMA AM-OLED CO., LTD., Shanghai (CN)

(72) Inventors: Angran Zhang, Shanghai (CN); Hamada Yuji, Shanghai (CN); Jinghua Niu, Shanghai (CN); Xiangcheng Wang, Shanghai (CN); Shuang Cheng, Shanghai (CN); Run Yang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 306 days.

(21) Appl. No.: 15/791,347

(22) Filed: Oct. 23, 2017

(65) Prior Publication Data

US 2018/0047927 A1 Feb. 15, 2018

(30) Foreign Application Priority Data

Jun. 13, 2017 (CN) .......................... 201710442724.5

(51) Int. Cl.
*H01L 51/50* (2006.01)
*H01L 51/52* (2006.01)
(Continued)

(52) U.S. Cl.
CPC .......... *H01L 51/5024* (2013.01); *G09G 3/12* (2013.01); *G09G 3/3208* (2013.01);
(Continued)

(58) Field of Classification Search
CPC ............. H01L 51/5024; H01L 27/3225; H01L 51/5076; H01L 51/5206; H01L 51/5221;
(Continued)

(56) References Cited

U.S. PATENT DOCUMENTS 9,911,932 B2 * 3/2018 Wang ................... C07D 221/08
10,535,824 B2 * 1/2020 Wang ................... C07D 413/14
(Continued)

FOREIGN PATENT DOCUMENTS

CN 102439746 A 5/2012
CN 106206958 A 12/2016
(Continued)

OTHER PUBLICATIONS

Wikipedia article on "Additive Color" public domain. Accessed Feb. 14, 2020. (Year: 2020).*
(Continued)

*Primary Examiner* — Dawn L Garrett
(74) *Attorney, Agent, or Firm* — Kilpatrick Townsend & Stockton, LLP (57) ABSTRACT

The present application discloses an organic light-emitting device and a display device. The organic light-emitting device comprises an anode, a cathode, and a blue light emitting layer, a green light emitting layer and a red light emitting layer between the anode and the cathode, and the blue light emitting layer comprises a blue thermally-activated delayed fluorescent material with a mass percent of 60-80%, the green light emitting layer comprises a green phosphorescent material and/or a green thermally-activated delayed fluorescent material, and the red light emitting layer comprises a red phosphorescent material and/or a red thermally-activated delayed fluorescent material.

28 Claims, 4 Drawing Sheets

(51) Int. Cl.
*G09G 3/12* (2006.01)
*G09G 3/3208* (2016.01)
*H01L 27/32* (2006.01)
*H01L 51/00* (2006.01)

(52) U.S. Cl.
CPC ........ *H01L 27/3225* (2013.01); *H01L 51/504* (2013.01); *H01L 51/5076* (2013.01); *H01L 51/5206* (2013.01); *H01L 51/5221* (2013.01); *H01L 51/5278* (2013.01); *H01L 51/0053* (2013.01); *H01L 51/0071* (2013.01); *H01L 51/0072* (2013.01); *H01L 51/0085* (2013.01); *H01L 51/0094* (2013.01)

(58) Field of Classification Search
CPC ............... H01L 51/504; H01L 51/5278; H01L 51/0053; H01L 51/0071; H01L 51/0072; H01L 51/0085; H01L 51/0094; H01L 51/5016; H01L 51/5262; H01L 2251/50; H01L 51/0032; H01L 51/005; H01L 51/0051; H01L 2251/5307; H01L 2251/5323; H01L 2251/5338; H01L 2251/5376; H01L 51/50; H01L 51/5004; H01L 51/52; H01L 51/5036; H01L 51/5044; G09G 3/12; G09G 3/3208
See application file for complete search history.

(56) References Cited

U.S. PATENT DOCUMENTS

| | | | | |
|---|---|---|---|---|
| 10,538,700 | B2 * | 1/2020 | Wang | C09K 11/06 |
| 2006/0040132 | A1 * | 2/2006 | Liao | H01L 51/5036 |
| | | | | 428/690 |
| 2006/0227079 | A1 * | 10/2006 | Kashiwabara | H01L 51/5044 |
| | | | | 345/76 |
| 2012/0098012 | A1 * | 4/2012 | Kim | H01L 51/5036 |
| | | | | 257/98 |
| 2015/0280158 | A1 * | 10/2015 | Ogiwara | H01L 51/5044 |
| | | | | 257/40 |
| 2015/0340623 | A1 * | 11/2015 | Kawamura | C07D 491/048 |
| | | | | 257/40 |
| 2016/0329512 | A1 * | 11/2016 | Nishide | H01L 51/504 |
| 2017/0253718 | A1 * | 9/2017 | Kamitani | C08G 77/08 |
| 2017/0256717 | A1 * | 9/2017 | Wang | H01L 51/0072 |
| 2017/0263871 | A1 * | 9/2017 | Wang | H05B 33/20 |
| 2017/0288149 | A1 * | 10/2017 | Danz | H01L 51/0053 |
| 2019/0131531 | A1 * | 5/2019 | Luschtinetz | C07F 9/5325 |

FOREIGN PATENT DOCUMENTS

| | | | | |
|---|---|---|---|---|
| CN | 106831633 A | * | 6/2017 | ............. H05B 33/20 |
| CN | 106831744 A | * | 6/2017 | ........... C07D 265/38 |
| CN | 106831745 A | * | 6/2017 | ......... H01L 51/0053 |
| CN | 106831817 A | * | 6/2017 | ......... H01L 51/0071 |
| WO | WO-2016042070 A1 | * | 3/2016 | ......... H01L 51/0053 |
| WO | WO-2017178392 A1 | * | 10/2017 | ............. C07F 9/5325 |

OTHER PUBLICATIONS

CN-106831744-A—translated (Year: 2017).*
CN-106831745-A—translated (Year: 2017).*
CN-106831633-A—translated (Year: 2017).*
CN-106831817-A—translated (Year: 2017).*
Advanced Materials, (2017), 29(22), 1605444 (54 pages). (Year: 2017).*
Mallesham Godumala et al., "Thermally activated delayed fluorescence blue dopanta and hosts: from the design strategy to organic light-emitting diode applications", Journal of Materials Chemistry C in Dec. 28, 2016, pp. 11355-11381, vol. 4, issue No. 48.

* cited by examiner

ORGANIC LIGHT-EMITTING DEVICE AND DISPLAY DEVICE

CROSS-REFERENCE TO RELATED APPLICATION

This application is related to and claims priority from Chinese Patent Application No. 201710442724.5, filed on Jun. 13, 2017, entitled "Organic Light-Emitting Device and Display Device," the entire disclosure of which is hereby incorporated by reference for all purposes.

TECHNICAL FIELD

The present application generally relates to the technical field of display, particularly to an organic light-emitting device and a display device.

BACKGROUND

With the development of information technology, the requirements of people on the performance of flat panel display are getting higher and higher. As a third generation display technology after cathode ray tube display and liquid crystal display, OLED (Organic Light-Emitting Diode) display has the advantages of low cost, wide viewing angle, low driving voltage, fast response speed, rich light-emitting color, simple preparation process, and capability of realizing large-area flexible display, and is considered one of the most promising display technologies.

Figure 1:
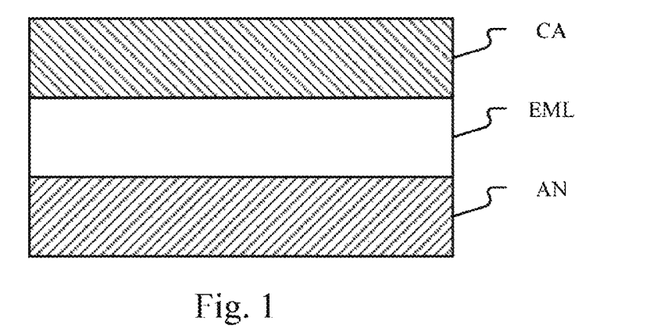
FIG. 1 shows a schematic diagram of an organic light-emitting device in the related art.

As shown in FIG. 1, an OLED device may generally include an anode AN, an organic light-emitting layer EML and cathode CA. When a driving voltage is applied to the cathode CA and the anode AN, electrons and holes are injected into the organic light-emitting layer EML from the cathode CA and the anode AN respectively and are compounded to generate excitons which jump from an excitation state to a ground state to emit light. According to spin-statistics theory, the ratio of generated singlet excitons to triplet excitons is 1:3.

For a fluorescent material, the triplet excitons accounting for 75% cannot emit light due to nonradiative transition, and light emission is transition light emission dominated by the singlet excitons accounting for 25%, which means that 75% of energy is not used for light emission.

In order to overcome the shortcoming of low light-emitting efficiency of the fluorescent material, the energy of a triplet is fully utilized, and a phosphorescent material with singlet excitons and triplet excitons participating in light emission has been developed. By doping a phosphorescent material into a host material, the triplet energy of the host material is effectively transferred to a phosphorescence doped material, and the phosphorescence doped material generates phosphorescence to emit light, thereby enabling the internal quantum efficiency to reach 100% theoretically.

Although a red phosphorescent material and a green phosphorescent material with a high efficiency have been developed, there is no blue phosphorescent material that satisfies both light-emitting efficiency and service life. Therefore, an existing OLED device usually utilizes a blue fluorescent material, which results in a lower light-emitting efficiency of a blue organic light-emitting device.

SUMMARY

In view of the defects or shortcomings in the prior art, an organic light-emitting device and a display device are expected to be provided to solve the technical problems in the prior art.

According to one aspect of the present application, an organic light-emitting device is provided and includes an anode, a cathode, and an organic light-emitting layer between the anode and the cathode, and the organic light-emitting layer includes a blue light emitting layer, a green light emitting layer and a red light emitting layer; the blue light emitting layer includes a blue thermally-activated delayed fluorescent material with a mass percent of 60-80%; the green light emitting layer includes a green phosphorescent material and/or a green thermally-activated delayed fluorescent material; and the red light emitting layer includes a red phosphorescent material and/or a red thermally-activated. delayed fluorescent material.

According to another aspect of the present application, a display device is further provided, and includes the above organic light-emitting device.

According to the organic light-emitting device and the display device, provided by the present application, the light-emitting efficiency of the organic light-emitting device is improved by setting the organic light-emitting device to have a multilayer structure with the blue light emitting layer, the green light emitting layer and the red light emitting layer laminated together, and enabling the blue light emitting layer to include the blue thermally-activated delayed fluorescent material with a mass ratio of 60-80%.

BRIEF DESCRIPTION OF THE DRAWINGS

Other features, objectives and advantages of the present application will become more apparent by reading a detailed description of the nonrestrictive embodiments made with reference to the following drawings.

DETAILED DESCRIPTION OF EMBODIMENTS

The present application will be further described below in detail in combination with the accompanying drawings and the embodiments. It should be appreciated that the embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 2:
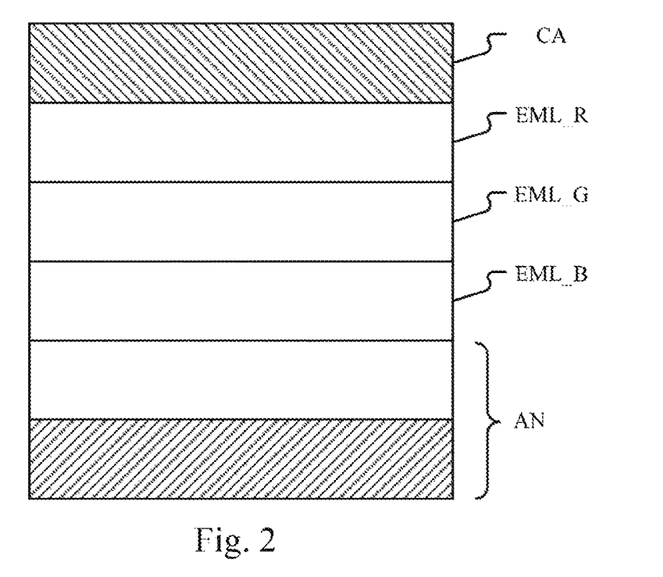
FIG. 2 shows a schematic diagram of the organic light-emitting device of one embodiment of the present application.

FIG. 2 shows a schematic diagram of the organic light-emitting device of one embodiment of the present application.

As shown in FIG. 2, the organic light-emitting device may include an anode AN, a cathode CA and an organic light-emitting layer between the anode AN and the cathode CA, and the organic light-emitting layer may include a blue light emitting layer EML_B, a green light emitting layer EML_G and a red light emitting layer EML_R.

Wherein, the blue light emitting layer EML_B may include a blue thermally-activated delayed fluorescent material (TADF), and the mass percent of the blue thermally-activated delayed fluorescent material may be 60-80%, i.e., the blue thermally-activated delayed fluorescent material serves as a host material of the blue light emitting layer EML_B.

The green light emitting layer EML_G may include a green phosphorescent material and/or a green thermally-activated delayed fluorescent material, and the red light emitting layer EML_R may include a red phosphorescent material and/or a red thermally-activated delayed fluorescent material.

The beneficial effects of the present embodiment are illustrated below.

A comparative embodiment and the present embodiment are white organic light-emitting devices with an identical structure (for example, the device structure shown in FIG. 2), the green light emitting layers of the two are doped with an identical green phosphorescent material (for example, tris[2-phenylpyridinato-C2,N]iridium (III), Ir(ppy)3 for short, with a mass ratio of 5%), and the red light emitting layers of the two are doped with an identical red phosphorescent material (for example, tris[1-phenylisoquinolinato-C2,N]iridium (III), Ir(piq)3 for short, with a mass ratio of 2%). The difference between the two is that the blue light emitting layer of the comparative embodiment is doped with a blue fluorescent material (for example, 4,4'-bis(9-ethyl-3-carbazovinylene)-1,1'-biphenyl, BCzVBi for short, with a mass ratio of 3%), but the blue light emitting layer of the present embodiment adopts a blue thermally-activated delayed fluorescent material with a mass percent of 60-80% as a host material. Table 1 shows the luminance, external quantum efficiency and driving voltage data of the organic light-emitting devices of the comparative embodiment and the present embodiment.

TABLE 1 luminance, external quantum efficiency and driving voltages of the organic light-emitting devices

|  | Luminance ($cd/m^2$) | External quantum efficiency (%) | Driving voltage (v) |
| --- | --- | --- | --- |
| The comparative embodiment | 554 | 6.9 | 6 |
| The present embodiment | 590 | 7.9 | 5.9 |

It can be seen from Table 1 that compared with the comparative embodiment, the luminance of the white organic light-emitting device of the present embodiment is increased by 36 $cd/m^2$ (about 6.5%), the external quantum efficiency is increased by 1% (about 14.5%), but the driving voltage is reduced by 0.1 v (about 1.7%).

In other words, the organic light-emitting device using the blue thermally-activated delayed fluorescent material as a host material has a higher light-emitting efficiency and a lower driving voltage.

It can be seen from the above that in the present embodiment, the light-emitting efficiency of the organic light-emitting device is improved by setting the organic light-emitting device to have a multilayer structure with the blue light emitting layer, the green light emitting layer and the red light emitting layer laminated together, and enabling the blue light emitting layer to include the blue thermally-activated delayed fluorescent material with a mass ratio of 60-80%.

In order to give a clearer picture of the beneficial effects of the present embodiment, the case of applying the blue thermally-activated delayed fluorescent material to a monochromatic organic light-emitting device will be illustrated below by comparison.

Light-emitting devices A and B are monochromatic (blue here) organic light-emitting devices with an identical structure (for example, a device structure shown in FIG. 1), and the difference between the two is that an organic light-emitting layer of the light-emitting device A is doped with a blue fluorescent material (for example, BCzVBi with a mass ratio of 3%), but an organic light-emitting layer of the light-emitting device B utilizes the blue thermally-activated delayed fluorescent material with a mass percent of 60-80% as a host material. Table 2 shows external quantum efficiency and driving voltage data of the organic light-emitting devices A and B.

TABLE 2

External quantum efficiency and driving voltages of the organic light-emitting devices A and B

|  | External quantum efficiency (%) | Driving voltage (v) |
| --- | --- | --- |
| Light-emitting device A | 7.427 | 3.90 |
| Light-emitting device B | 8.889 | 3.27 |

It can be seen from Table 2 that compared with the light-emitting device A, the external quantum efficiency of the light-emitting device B is increased from 7.427% to 8.889% (by about 19.7%), but the driving voltage of the light-emitting device B is reduced by 0.63 v (by about 16.2%).

In other words, the organic light-emitting device using the blue thermally-activated delayed fluorescent material as a host material has a higher light-emitting efficiency and a lower driving voltage.

That is because the difference ($\Delta Est$) between the singlet energy level and the triplet energy level of the thermally-activated delayed fluorescent material is small (usually less than 0.3 eV), the triplet exciton of the material may be transformed into a singlet exciton through reverse intersystem crossing (RISC) under environment thermal energy, and the material emits light through fluorescent radiation, therefore, the internal quantum efficiency of the thermally-activated delayed fluorescent material may also reach 100% theoretically:

In the related art, a light-emitting material (such as, a fluorescent material, a phosphorescent material, or the like) is usually used as a host material (i.e., the doping ratio is less than 50%) in a light-emitting layer, but the present application overcomes this technical prejudice by using the blue thermally-activated delayed fluorescent material as the host material of the blue light emitting layer.

The inventors have found that when the blue thermally-activated delayed fluorescent material serves as a host material, with the change of the mass percent thereof in the blue light emitting layer, the light-emitting efficiency of blue light emitting layer first will increase with the increase of the mass percent, and when the light-emitting efficiency increases to a certain peak value, the light-emitting efficiency will decrease with the increase of the mass percent. Through experiments, it can be measured that the light-emitting efficiency of blue light emitting layer is basically the highest when the mass percent of blue thermally-activated delayed fluorescent material is 65-67%.

Therefore, the blue light emitting layer will obtain a better light-emitting efficiency by setting the mass percent of the blue thermally-activated delayed fluorescent material between 60% and 80%.

Although FIG. 2 shows that the cathode CA is above the anode AN, it is only schematic. It should be appreciated that the positions of the cathode CA and the anode AN can be interchanged, and can be set by those skilled in the art according to needs of actual application scenarios.

Although the present embodiment describes the case that the organic light-emitting device is doped with a red phosphorescent material and a green phosphorescent material, the present embodiment is not limited to this. It should be understood that the red thermally-activated delayed fluorescent material may be used for replacing the red phosphorescent material and/or the green thermally-activated delayed fluorescent material may be used for replacing the green phosphorescent material.

For example, when the red light emitting layer EML_R utilizes the red thermally-activated delayed fluorescent material of 60-80% as the host material, and the green light emitting layer EML_G utilizes the green thermally-activated delayed fluorescent material of 60-80% as the host material, it can be obtained through experiments that the brightness, external quantum efficiency and driving voltage of the organic light-emitting device are 725 cd/m$^2$, 10.9% and 5.5V respectively. In other words, in this case, although the driving voltage is slightly increased (by about 3.8%), the organic light-emitting device can achieve a higher light-emitting efficiency (increased by about 7.9%) and a higher brightness (increased by about 18.1%).

it should be understood that, the red thermally-activated delayed fluorescent material and/or the green thermally-activated delayed fluorescent material may be used as a host material as mentioned above, but the present embodiment is not limited to this. It should be understood that, the red thermally-activated delayed fluorescent material and/or the green thermally-activated delayed fluorescent material may also be used as a dopant doped material, i.e., the mass percent of the material, for example, is not more than 10%.

In the organic light-emitting device, the blue light emitting layer EML_B, the green light emitting layer EML_G and the red light emitting layer EML_R may be laminated together in any suitable order, for example, the blue light emitting layer EML_B/the green light emitting layer EML_G/the red light emitting layer EML_R, the red light emitting layer EML_R/the blue light emitting layer EML_B/the green light emitting layer EML_G, the blue light emitting layer EML_B/the red light emitting layer EML_R/the green light emitting layer EML_G, or the red light emitting layer EML_R/the green light emitting layer EML_G/the blue light emitting layer EML_B, or the like.

In one embodiment, the blue light emitting layer EML_B is arranged between the cathode CA and the green light emitting layer EML_G, and the green light emitting layer EML_G is arranged between the blue light emitting layer EML_B and the red light emitting layer EML_R.

Hereinafter, different effects brought by different laminating orders are illustrated in combination with FIG. 2. and FIG. 3A-FIG. 3C.

Figure 3A:
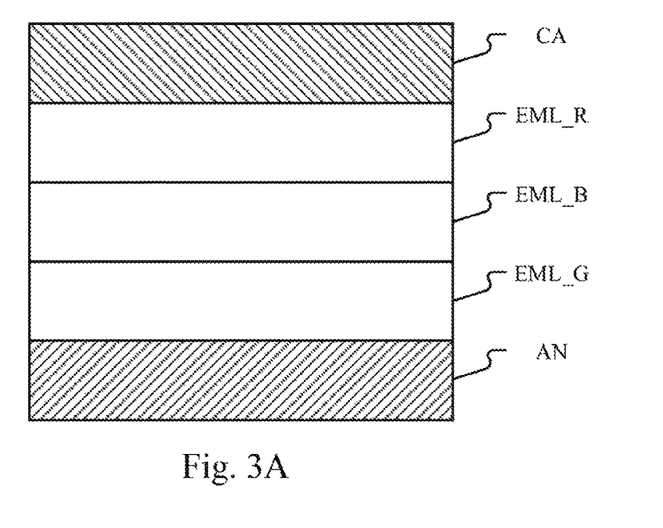
FIG. 3A-FIG. 3C show a schematic diagram of the organic light-emitting device with different laminating orders.
Figure 3B:
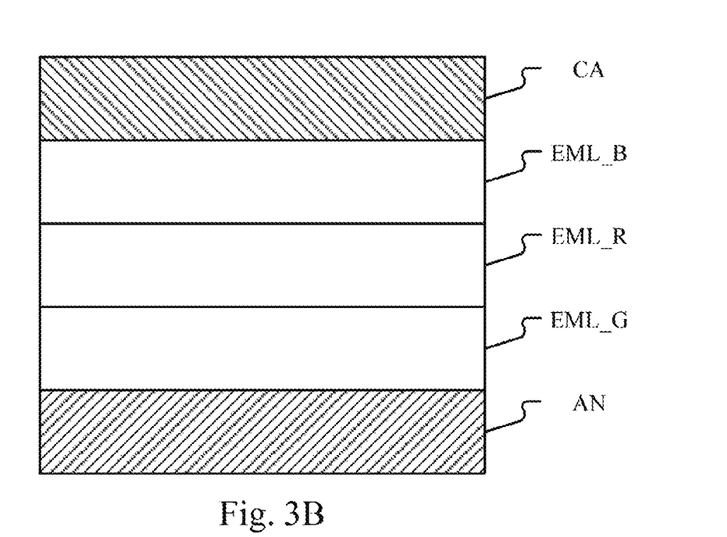
Figure 3C:
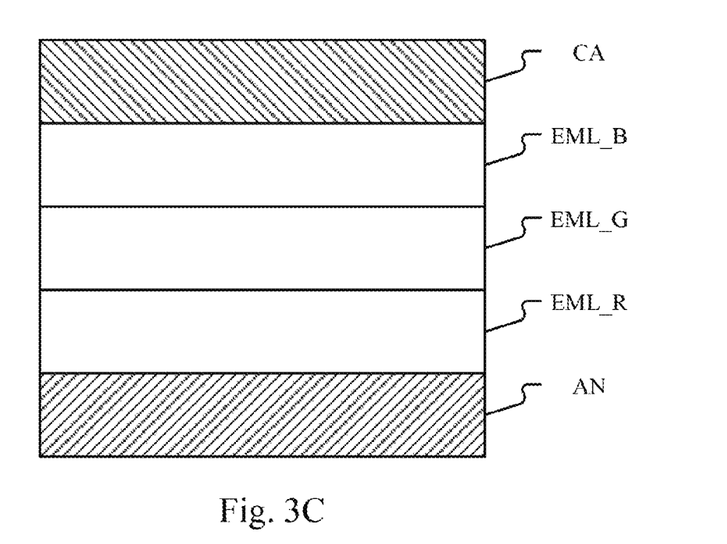

The organic light-emitting device with a laminated structure of the red light emitting layer EML_R/the blue light emitting layer EML_B/the green light emitting layer EML_G, as shown in FIG. 3A, is used as a light-emitting device C, the organic light-emitting device with a laminated structure of the blue light emitting layer EML_B/the red light emitting layer EML_R/the green light emitting layer EML_G, as shown in FIG. 3B, is used as a light-emitting device D, the organic light-emitting device with a laminated structure of the red light emitting layer EML_R/the green light emitting layer EML_G/the blue light emitting layer EML_B, as shown in FIG. 3C, is used as a light-emitting device E, and each layer of the light-emitting devices C-E, and each layer in the embodiment shown in FIG. 2 are made of an identical material. Table 3 shows performance parameters of the light-emitting devices C-E and the embodiment in FIG. 2.

TABLE 3 luminance, external quantum efficiency and driving voltages of the organic light-emitting devices

|  | Luminance (cd/m$^2$) | External quantum efficiency (%) | Driving voltage (v) |
| --- | --- | --- | --- |
| Embodiment | 590 | 7.9 | 5.9 |
| Light-emitting device C | 613 | 8.6 | 5.8 |
| Light-emitting device D | 652 | 7.5 | 6.1 |
| Light-emitting device E | 614 | 10.1 | 5.3 |

It can be seen from Table 3 that compared with the embodiment and the light-emitting device C, the light-emitting device E has a higher luminance and external quantum efficiency and a lower driving voltage; and compared with the light-emitting device D, although the luminance of the light-emitting device E is slightly lower, the advantages of the external quantum efficiency and driving voltage are more obvious. Thus, in general, the light-emitting device E has better performance parameters.

In other words, when the organic light-emitting layer has a laminated structure of the red light emitting layer EML_R/the green light emitting layer EML_G/the blue light emitting layer EML_B, the organic light-emitting device may achieve a better light-emitting efficiency.

In one embodiment, the blue thermally-activated delayed fluorescent material may contain at least one of acridine, triazine, quinazoline, carbazole and derivatives, dibenzofuran, dibenzothiophene, benzene, biphenyl, naphthalene, and anthracene.

Because the thermally-activated delayed fluorescent materials with the above groups may have a smaller ΔEst easily, may achieve transformation from triplet excitons to singlet excitons easily, and may be used as a blue thermally-activated delayed fluorescent material, thereby enriching the selection of organic light-emitting materials, especially the selection of blue light-emitting materials.

In one embodiment, when the green light emitting layer EML_G includes the green thermally-activated delayed fluorescent material, the green thermally-activated delayed fluorescent material may contain at least one of acridine, triazine, quinazoline, carbazole and derivatives, dibenzofuran, dibenzothiophene, benzene, biphenyl, naphthalene, and anthracene, In one embodiment, when the red light emitting layer EML_R includes the red thermally-activated delayed fluorescent material, the red thermal-activated delayed fluorescent material may contain at least one of acridine, triazine, quinazoline, carbazole and derivatives, dibenzofuran, dibenzothiophene, benzene, biphenyl, naphthalene, and anthracene.

In one embodiment, the blue thermally-activated delayed fluorescent material may contain a group with a following structure:

wherein, X is C, O, S, N or Si.

In addition, because the singlet energy level and the triplet energy level in a thermally-activated delayed fluorescent material are adjacent energy levers, and the thermally-activated delayed fluorescent material transforms the triplet energy level into the singlet energy level through reverse intersystem crossing, in order to efficiently generate the reverse intersystem crossing, the difference ΔEst between the singlet energy level and the triplet energy level needs to be further reduced.

In one embodiment, the difference ΔEst between the singlet energy level and the triplet energy level of the blue thermally-activated delayed fluorescent material may be less than 0.15 eV. In this way, the reverse intersystem crossing in the blue light emitting layer EML_B may be generated more efficiently, thereby further improving the light-emitting efficiency of the organic light-emitting device.

In one embodiment, the photoluminescence spectrum wavelength range λ of the blue thermally-activated delayed fluorescent material may be 450-470 nm.

A photoluminescence spectrum refers to intensity or energy distribution of light emitted at different wavelengths by a light-emitting material under the excitation of light with a specific wavelength. A luminescent spectrum of many light-emitting materials is a continuous spectral band and consists of one or more peak-like curves. The narrower the spectral wavelength range is, the higher the light-emitting efficiency is, and the higher the color purity of the emitted light is; and experimental results show that a blue light-emitting material has a highest light-emitting efficiency and a highest color purity when the peak value of the luminescent spectrum is 460 nm. Thus, when the photoluminescence spectrum wavelength range λ is between 450 nm and 470 nm, the blue thermally-activated delayed fluorescent material may have a higher light-emitting efficiency and color purity.

Further, the blue thermally-activated delayed fluorescent material may include at least one of:

(compound ①)

and (compound ②)

Table 4 shows characteristic parameters of the compound ① and the compound ②.

TABLE 4

| Characteristic parameters of the compound① and compound② | | |
|---|---|---|
| | ΔEst (eV) | Photoluminescence spectrum wavelength λ (nm) |
| Compound① | 0.0837 | 470.0 |
| Compound② | 0 | 457.94 |

It can be seen from Table 4 that the differences ΔEst between singlet energy levels and triplet energy levels of the compound ① and the compound ② are less than 0.15 eV, and the photoluminescence spectrum wavelength ranges λ are between 450 nm and 470 nm. When the compounds are used as a host material of the blue light emitting layer EML_B, the organic light-emitting device may have a better light-emitting efficiency.

Similarly, when the green light emitting layer EML_G includes a green thermally-activated delayed fluorescent material, the green thermally-activated delayed fluorescent material may further contain a group with a following structure:

In one embodiment, the difference ΔEst between the singlet energy level and the triplet energy level of the green thermally-activated delayed fluorescent material may be less than 0.15 eV. In this way, the reverse intersystem crossing in the green light emitting layer EML_G may be generated more efficiently, thereby further improving the light-emitting efficiency of the organic light-emitting device.

In one embodiment, the photoluminescence spectrum wavelength range of the green thermally-activated delayed fluorescent material may be 525-540 nm.

Experimental results show that the light-emitting efficiency of a green light material is highest and its color purity is also highest when the peak value of the luminescent spectrum is near 530 nm. Thus, when the photoluminescence spectrum wavelength range λ is between 525 nm and 540 nm, the green thermally-activated delayed fluorescent material may have a higher light-emitting efficiency and color purity.

Further, the green thermally-activated delayed fluorescent material may include at least one of:

Table 5 shows characteristic parameters of the compound ③, the compound ④ and the compound ⑤.

TABLE 5

| Characteristic parameters of the compound③, compound④ and compound⑤ | | |
|---|---|---|
| | ΔEst (eV) | Photoluminescence spectrum wavelength λ (nm) |
| Compound③ | 0.0155 | 525.9 |
| Compound④ | 0.0119 | 539.3 |
| Compound⑤ | 0.03 | 528.65 |

It can be seen from Table 5 that the differences ΔEst between singlet energy levels and triplet energy levels of the compound ③, the compound ④ and the compound ⑤ are less than 0.15 eV, and the photoluminescence spectrum wavelength ranges λ are between 525 nm and 540 nm. When the compounds are used as an organic material of the green light emitting layer EML_G, the organic light-emitting device may have a better light-emitting efficiency.

Similarly, when the red light emitting layer EML_R includes a red thermally-activated delayed fluorescent material, the red thermally-activated delayed fluorescent material may further contain a group with a following structure:

In one embodiment, the difference ΔEst between the singlet energy level and the triplet energy level of the red thermally-activated delayed fluorescent material may be less than 0.15 eV. In this way, the reverse intersystem crossing in the red light emitting layer EML_R may be generated more efficiently, thereby further improving the light-emitting efficiency of the organic fight-emitting device.

In one embodiment, the photoluminescence spectrum wavelength range of the red thermally-activated delayed fluorescent material may be 610-620 nm.

Experimental results show that the light-emitting efficiency of a red light material is highest and its color purity is also highest when the peak value of the luminescent spectrum is near 610 nm. Thus, when the photoluminescence spectrum wavelength range λ is between 610 nm and 620 nm the red thermally-activated delayed fluorescent material may have a higher light-emitting efficiency and color purity.

Further, the red thermally-activated delayed fluorescent material may include:

Table 6 shows characteristic parameters of the compound ⑥.

TABLE 6

Characteristic parameters of the compound ⑥.

| | ΔEst (eV) | Photoluminescence spectrum wavelength λ (nm) |
|---|---|---|
| Compound ⑥ | 0.1409 | 618.2 |

It can be seen from Table 6 that the difference ΔEst between the singlet energy level and the triplet energy level of the compound ⑥ is less than 0.15 eV, and the photoluminescence spectrum wavelength range λ is between 610 nm and 620 nm. When the compound is used as an organic material of the red light emitting layer EML_R, the organic light-emitting device may have a better light-emitting efficiency.

Figure 4:
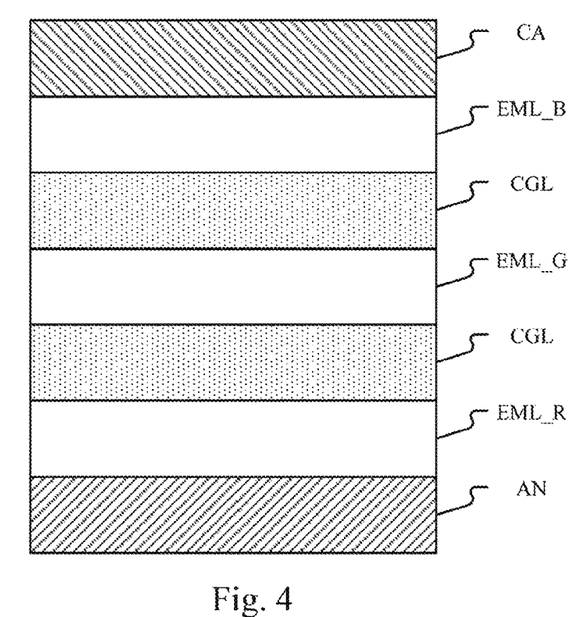
FIG. 4 shows a schematic diagram of the organic light-emitting device of another embodiment of the present application.

Continue to refer to FIG. 4, it shows a schematic diagram of the organic light-emitting device of another embodiment of the present application.

Similar to the embodiment shown in FIG. 2, the organic light-emitting device in the present embodiment may also include an anode AN, a red light emitting layer EML_R, a green light emitting layer EML_G, a blue light emitting layer EML_B and a cathode CA.

Unlike the embodiment shown in FIG. 2, as shown in FIG. 4, the organic light-emitting device in the present embodiment may further include at least one charge generation layer CGL for improving the recombination efficiency of current carriers.

In one embodiment, the charge generation layer CGL may be arranged between the blue light emitting layer EML_B and the green light emitting layer EML_G, and/or between the green light emitting layer EML_G and the red light emitting layer EML_B.

In the present embodiment, because of the organic light-emitting layer with a multilayer structure, the organic light-emitting device has a higher light-emitting efficiency. In addition, by setting the charge generation layer, the organic light-emitting device further has a higher luminous brightness and current efficiency.

Although two charge generation layers CGL are shown in FIG. 4, the present embodiment is not limited to this. It should be understood that the organic light-emitting device may further include other appropriate number of charge generation layers CGL, for example, one, three or the like.

In order to avoid the driving voltage from being correspondingly increased (to increase the power loss) while the current density of the organic light-emitting device is increased, the charge generation layer CGL may contain a material for promoting hole injection on one side adjacent to the cathode of CA, and may also contain a material for promoting electron injection on one side adjacent to the anode AN.

In one embodiment, the charge generation layer CGL is doped with a p-type material on one side adjacent to the cathode CA and/or doped with an n-type material on one side adjacent to the anode AN, the doping concentration is 0.5-10%, and the thickness of the charge generation layer is 50-500 nm.

More current carriers may be generated under a certain voltage by performing p doping and/or n doping on the charge generation layer CGL, thereby generating a greater current without increasing the voltage accordingly.

In one embodiment, the p-type material includes at least one of:

In one embodiment, the n-type material includes at least one of Yb, Mg, Al, Ca and compounds thereof.

Figure 5:
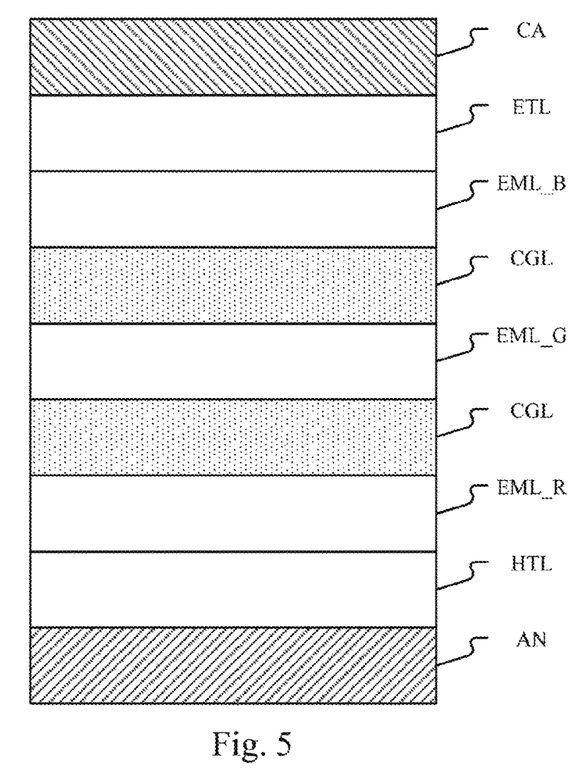
FIG. 5 shows a schematic diagram of the organic light-emitting device of another embodiment of the present application.

Continue to refer to FIG. 5, it shows a schematic diagram of the organic light-emitting device of another embodiment of the present application.

Similar to the embodiment shown in FIG. 4, the organic light-emitting device in the present embodiment may also include an anode AN, a red light emitting layer EML_R, a green light emitting layer EML_G, a blue light emitting layer EML_B, a cathode CA and a plurality of charge generation layers CGL.

Unlike the embodiment shown in FIG. 4, as shown in FIG. 5, the organic light-emitting device in the present embodiment may further include an electron transport layer ETL and a hole transport layer HTL.

In one embodiment, the electron transport layer ETL is arranged between the cathode CA and the blue light emitting layer EML_B to transport injected electrons to the blue light emitting layer EML_B. The hole transport layer HTL is arranged between the anode AN and the red light emitting layer EML_R to transport injected holes to the red light emitting layer EML_R.

In the present embodiment, because of the organic light-emitting layer with a multilayer structure, the organic light-emitting device has a higher light-emitting efficiency. In addition, by setting the electron transport layer and the hole transport layer, the electron and hole transport characteristics of the organic light-emitting device are enhanced, and then the recombination efficiency of the current carriers is improved.

Although FIG. 5 shows that the organic light-emitting device includes one electron transport layer ETL and one hole transport layer HTL, the present embodiment is not limited to this. It should be understood by those skilled in the art that in order to further enhance the electron/hole transport characteristics, the organic light-emitting device may have a plurality of electron transport layers ETL and a plurality of hole transport layers HTL, for example, they may be arranged between the blue light emitting layer EML_B and the green light emitting layer EML_G and/or between the green light emitting layer EML_G and the red light emitting layer EML_R.

In one embodiment, the electron transport layer ETL may use an organic compound matching a work function (low work function) of the cathode CA. In addition, in order to better realize the energy level matching between the cathode CA and a light emitting layer (for example, a blue organic light-emitting layer EML_B), the LUMO energy level of the electron transport layer ETL may be 2.3-3.8 eV.

In one embodiment, the hole transport layer HU, may use an organic compound matching a work function (high work function) of the anode AN. In addition, in order to better realize the energy level matching between the anode AN and a light emitting layer (for example, a red organic light-emitting layer EML_R), the HOMO energy level of the hole transport layer HTL may be 4.8-6.2 eV.

In addition, the organic light-emitting device may further include an electron injection layer and a hole injection layer (not shown). The electron injection layer may be arranged between the cathode CA and the electron transport layer ETL to reduce the electron injection barrier from the cathode CA to the electron transport layer ETL. The hole injection layer may be arranged between the anode AN and the hole transport layer HTL to reduce the hole injection barrier from the anode AN to the hole transport layer HTL.

In addition, the blue thermally-activated delayed fluorescent material serves as a host material of the blue light emitting layer EML_B, and a dopant material may be doped in the blue thermally-activated delayed fluorescent material. In order to realize energy transfer from the host material to the dopant material, the HOMO energy level of the dopant material may be lower than the HOMO energy level of the blue thermally-activated delayed fluorescent material (i.e., the host material) HOMO level, and the LUMO energy level of the dopant material is higher than the LUMO energy level of the blue thermally-activated delayed fluorescent material. Moreover, in order to match the energy level of, for example, the electron transport layer ETL, the LUMO energy level of the dopant material may be 2.0-2.4 eV.

When the green light emitting layer EML_G includes a green phosphorescent material, the green phosphorescent material may have the LUMO energy level of 1.7-2.2 eV and a photoluminescence spectrum wavelength range of 515-545 nm.

Further, the green phosphorescent material includes at least one of and

When the red light emitting layer EML_R includes a red phosphorescent material, the red phosphorescent material may have the lowest unoccupied molecular orbital energy level of 2.0-2.4 eV and a photoluminescence spectrum wavelength range of 600-700 nm.

Further, the red phosphorescent material includes:

and

According to a light exit direction, the organic light-emitting device in each embodiment of the present application may be of a top emission type or a bottom emission type. In a bottom emission structure, light exits from the bottom (for example, the anode AN side) of the organic light-emitting device, but in a top emission structure, the light exits from the top (for example, the cathode CA side) of the organic light-emitting device.

Because most organic materials for electroluminescence have an LIMO energy level of 2.5-3.5 eV and an HOMO energy level of 5-6 eV, in order to reduce the injection barriers of electrons and holes, the cathode CA needs to utilize a metal material with a low work function, while the anode AN needs to utilize a material with a high work function.

The material used as the anode AN may include a transparent conducting oxide and a metal, and usually the transparent conducting oxide is utilized, for example, ITO (Indium Tin Oxide) with a thickness of 10-100 nm. In the top emission structure, because the anode AN serves as a reflecting electrode, it may include a light-tight metal material, for example, Ag. In other words, the anode AN may be a two-layer structure (for example, ITO/Ag, as shown in FIG. 2) or a multilayer structure (for example, ITO/Ag/ITO) composed of the transparent conducting material and a first metal conducting material.

The material used as the cathode CA may include an alkali metal, an alkaline earth metal or a lanthanide series metal, for example. Ni, Au, Ag, Pt or Cu. In addition, in order to overcome a problem of high chemical activity of some metals (easily oxidized or stripped), a metal alloy (e.g., Mg:Ag or Li:Al) with stable chemical properties may be utilized to form the cathode CA.

In one embodiment, the cathode CA may be an magnesium-silver alloy, and the thickness of the cathode CA may be 10-50 nm. The addition of silver improves the chemical stability of the cathode CA and enhances the adhesion between the cathode CA and an organic layer (e.g., an electron injection layer)

Figure 6:
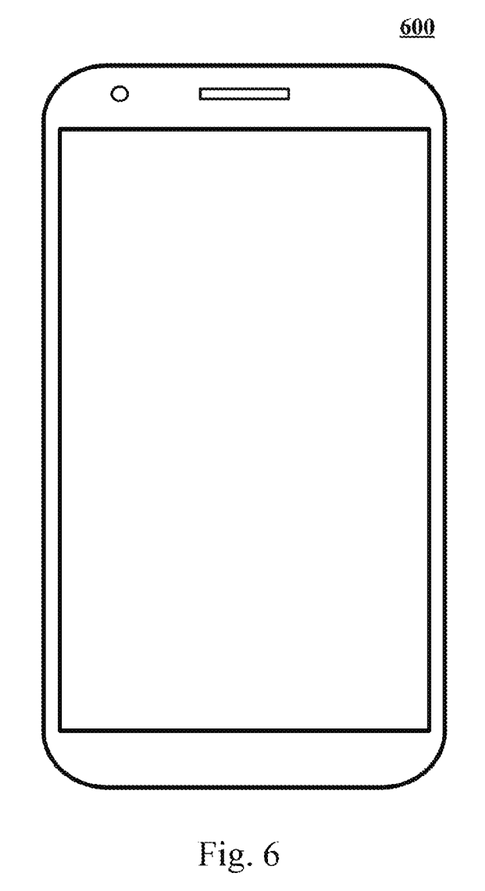
FIG. 6 shows a schematic structure diagram of an embodiment of the display panel of the present application.

The present application further discloses a display device, as shown in FIG. 6. Wherein, the display device 600 may include the organic light-emitting device described above. It should be understood by those skilled in the art that the display device may further include some other known structures, for example, a substrate, a thin-film transistor and the like, in addition to the organic light-emitting device described above. In order not to obscure the focus of the present application, these known structures will no longer be further described.

The display device of the present application may be any device containing the organic light-emitting device described above, including but not limited to, as shown in FIG. 6, a cellular mobile phone 600, a tablet computer, a computer display, a display applied to a smart wearable device, a display device applied to means of transportation, such as an automobile, and the like. As long as a display device contains the structure of the organic light-emitting device disclosed by the present application, it is deemed to fall within the scope of protection of the present application.

The organic light-emitting device and display device provided by the present application have an organic light-emitting layer formed by laminating a plurality of layers of materials together, and the blue light emitting layer utilizes the blue thermally-activated delayed fluorescent material as the host material to improve the light-emitting efficiency of the organic light-emitting device.

The above description only provides an explanation of the embodiments of the present application and the technical principles used. It should be appreciated by those skilled in the art that the inventive scope of the present application is not limited to the technical solutions formed by the particular combinations of the above-described o technical features. The inventive scope should also cover other technical solutions formed by any combinations of the above-described technical features or equivalent features thereof without departing from the concept of the disclosure. Technical schemes formed by the above-described features being interchanged with, but not limited to, technical features with similar functions disclosed in the present application are examples,

What is claimed is:
1. An organic light-emitting device, comprising:
an anode, a cathode, and an organic light-emitting layer between the anode and the cathode, wherein the organic light-emitting layer comprises a blue light emitting layer, a green light emitting layer and a red light emitting layer, and the blue light emitting layer is arranged between the cathode and the green light emitting layer, and the green light emitting layer is arranged between the blue light emitting layer and the red light emitting layer;
the blue light emitting layer comprises a blue thermally-activated delayed fluorescent material with a mass percent between 60-80%; and
the green light emitting layer comprises at least one of a green phosphorescent material and a green thermally-activated delayed fluorescent material, and the red light emitting layer comprises at least one of a red phosphorescent material and a red thermally-activated delayed fluorescent material,
wherein the blue thermally-activated delayed fluorescent material comprises at least one of

2. The organic light-emitting device according to claim 1, wherein a charge generation layer is arranged between the blue light emitting layer and the green light emitting layer, and/or between the green light emitting layer and the red light emitting layer.

3. The organic light-emitting device according to claim 1, wherein when the green light emitting layer comprises a green thermally-activated delayed fluorescent material and/or when the red light emitting layer comprises a red thermally-activated delayed fluorescent material, the green thermally-activated delayed fluorescent material and/or the red thermally-activated delayed fluorescent material comprises one or more of:
acridine, triazine, quinazoline, carbazole and derivatives, dibenzofuran, dibenzothiophene, benzene, biphenyl, naphthalene, and anthracene.

4. The organic light-emitting device according to claim 1, wherein when the green light emitting layer comprises a green thermally-activated delayed fluorescent material, the green thermally-activated delayed fluorescent material comprises a structure of:

where X is C, O, S, N or Si; and/or
when the red light emitting layer comprises a red thermally-activated delayed fluorescent material, the red thermally-activated delayed fluorescent material comprises a structure of:

where X is C, O, S, N or Si.

5. The organic light-emitting device according to claim 4, wherein a difference between a singlet energy level and a triplet energy level of the green thermally-activated delayed fluorescent material and/or the red thermally-activated delayed fluorescent material is less than or equal to 0.15 eV.

6. The organic light-emitting device according to claim 5, wherein when the green light emitting layer comprises a green thermally-activated delayed fluorescent material, a photoluminescence spectrum wavelength of the green thermally-activated delayed fluorescent material is between 525-540 nm.

7. The organic light-emitting device according to claim 5, wherein when the red light emitting layer comprises a red thermally-activated delayed fluorescent material, a photoluminescence spectrum wavelength of the red thermally-activated delayed fluorescent material is between 610-620 nm.

8. An organic light-emitting device, comprising:
an anode, a cathode, and an organic light-emitting layer between the anode and the cathode, wherein the organic light-emitting layer comprises a blue light emitting layer, a green light emitting layer and a red light emitting layer, and the blue light emitting layer is arranged between the cathode and the green light emitting layer, and the green light emitting layer is arranged between the blue light emitting layer and the red light emitting layer;
the blue light emitting layer comprises a blue thermally-activated delayed fluorescent material with a mass percent between 60-80%; and
the green light emitting layer comprises at least one of a green phosphorescent material and a green thermally-activated delayed fluorescent material, and the red light emitting layer comprises at least one of a red phosphorescent material and a red thermally-activated delayed fluorescent material,
wherein the green thermally-activated delayed fluorescent material comprises at least one of and

9. The organic light-emitting device according to claim 7, wherein the red thermally-activated delayed fluorescent material comprises:

10. The organic light-emitting device according to claim 1, wherein when the green light emitting layer comprises a green phosphorescent material, the green phosphorescent material has a lowest unoccupied molecular orbital energy level of 1.7-2.2 eV and a photoluminescence spectrum wavelength of the green phosphorescent material is between 515-545 nm.

11. The organic light-emitting device according to claim 10, wherein the green phosphorescent material comprises at least one of:

and

-continued

12. The organic light-emitting device according to claim 1, wherein when the red light emitting layer comprises a red phosphorescent material, the red phosphorescent material has a lowest unoccupied molecular orbital energy level of 2.0-2.4 eV and a photoluminescence spectrum wavelength of the red phosphorescent material is between 600-700 nm.

13. The organic light-emitting device according to claim 12, wherein the red phosphorescent material comprises:

14. The organic light-emitting device according to claim 1, wherein the blue thermally-activated delayed fluorescent material is doped with a dopant material with a lowest unoccupied molecular orbital energy level of 2.0-2.4 eV; and
a highest occupied molecular orbital energy level of the dopant material is lower than a highest occupied molecular orbital energy level of the blue thermally-activated delayed fluorescent material, and a lowest unoccupied molecular orbital energy level of the dopant material is higher than a lowest unoccupied molecular orbital energy level of the blue thermally-activated delayed fluorescent material.

15. The organic light-emitting device according to claim 2, wherein the charge generation layer is doped with a p-type material on a side adjacent to the cathode and/or doped with an n-type material on a side adjacent to the anode, with a doping concentration of 0.5-10%, and a thickness of the charge generation layer is between 50-500 nm.

16. The organic light-emitting device according to claim 15, wherein the p-type material comprises at least one of:

17. The organic light-emitting device according to claim 15, wherein the n-type material comprises at least one of Yb, Mg, Al, Ca and compounds thereof.

18. The organic light-emitting device according to claim 1, further comprising a hole transport layer and an electron transport layer, wherein the hole transport layer is arranged between the anode and the organic light-emitting layer, and the electron transport layer is arranged between the cathode and the organic light-emitting layer.

19. The organic light-emitting device according to claim 18, wherein a highest occupied molecular orbital energy level of the hole transport layer has a range of 4.8-6.2 eV.

20. The organic light-emitting device according to claim 19, wherein a lowest unoccupied molecular orbital energy level of the electron transport layer has a range of 2.3-3.8 eV.

21. The organic light-emitting device according to claim 1, wherein the organic light-emitting device is of a top emission type or a bottom emission type.

22. The organic light-emitting device according to claim 1, wherein the anode comprises a transparent conducting material with a thickness of between 10-100 nm; and the cathode comprises a metal conducting material with a thickness of between 10-50 nm.

23. The organic light-emitting device according to claim 22, wherein the anode further comprises a light-tight metal conducting material.

24. A display device, comprising an organic light-emitting device, the organic light-emitting device comprising an anode, a cathode, and an organic light-emitting layer between the anode and the cathode, wherein the organic light-emitting layer comprises a blue light emitting layer, a green light emitting layer and a red light emitting layer, and the blue light emitting layer is arranged between the cathode and the green light emitting layer, and the green light emitting layer is arranged between the blue light emitting layer and the red light emitting layer;
the blue light emitting layer comprises a blue thermally-activated delayed fluorescent material with a mass percent of 60-80%; and the green light emitting layer comprises a green phosphorescent material and/or a green thermally-activated delayed fluorescent material, and the red light emitting layer comprises a red phosphorescent material and/or a red thermally-activated delayed fluorescent material, wherein the blue thermally-activated delayed fluorescent material comprises at least one of and 25. The organic light-emitting device according to claim 8, wherein the blue thermally-activated delayed fluorescent material comprises one or more of:
acridine, triazine, quinazoline, carbazole and derivatives, dibenzofuran, dibenzothiophene, benzene, biphenyl, naphthalene, and anthracene.

26. The organic light-emitting device according to claim 8, wherein the blue thermally-activated delayed fluorescent material comprises a structure of:

where X is C, O, S, N or Si.

27. The organic light-emitting device according to claim 26, wherein a difference between a singlet energy level and a triplet energy level of the blue thermally-activated delayed fluorescent material is less than or equal to 0.15 eV.

28. The organic light-emitting device according to claim 27, wherein a photoluminescence spectrum wavelength of the blue thermally-activated delayed fluorescent material is between 450-470 nm.

* * * * *